United States Patent [19]

Cohen et al.

[11] 4,380,710
[45] Apr. 19, 1983

[54] TTL TO CMOS INTERFACE CIRCUIT

[75] Inventors: Paul B. Cohen, New City, N.Y.; William R. Young, Indialantic; W. Dale Edwards, Indian Harbour Beach, both of Fla.

[73] Assignee: Harris Corporation, Melbourne, Fla.

[21] Appl. No.: 231,671

[22] Filed: Feb. 5, 1981

[51] Int. Cl.[3] .............. H03K 19/092; H03K 19/094; H03K 19/20; H03K 17/04
[52] U.S. Cl. .................................. 307/475; 307/451; 307/579; 307/585
[58] Field of Search .............. 307/451, 443, 475, 576, 307/579, 585, 562; 330/257, 277

[56] References Cited

U.S. PATENT DOCUMENTS

| | | | |
|---|---|---|---|
| 3,676,700 | 7/1972 | Buchanan | 307/475 |
| 4,258,272 | 3/1981 | Huang | 307/475 |
| 4,295,065 | 10/1981 | Hsieh et al. | 307/451 X |
| 4,342,928 | 8/1982 | Gschwendtner et al. | 307/475 |

Primary Examiner—Larry N. Anagnos
Assistant Examiner—David R. Hudspeth
Attorney, Agent, or Firm—Leitner, Palan, Martin & Bernstein

[57] ABSTRACT

An interface circuit including a FET inverter with its N channel device being part of the controlled leg of a first current mirror and its P channel device being part of the controlled leg of a second current mirror. The operating point of the inverter is the reference signal applied on the input to the current mirrors. The controlled leg of the first current mirror includes a variable current source responsive to the input signal and the controlled leg of the second current mirror includes a variable current sink for improving the response time of the inverter and compensates the inverter for manufacturing tolerances.

10 Claims, 3 Drawing Figures

TTL TO CMOS INTERFACE CIRCUIT

BACKGROUND OF THE INVENTION

The present invention relates generally to interface circuits and more specifically for a circuit interfacing transistor to transistor logic (TTL) to complementary metal oxide semiconductor (CMOS) insulated gate field effect transistor circuits.

As is well known, there is difficulty in interfacing a TTL circuit which has the designed voltage variation of 0.8 to 2.0 volts with CMOS circuits which are designed for voltage variations in the range of 0 to approximately 15 volts. One class of interface circuits has used ratioed CMOS inverters as the output drive circuit. These inverters are generally slow and must drive high capacitive loads. One method of increasing the speed of the interface circuit is described in U.S. Pat. No. 3,900,746 to Kraft et al. A divertable current sink in the form of a third field effect transistor is connected in series with the inverter. Although Kraft et al is an improvement over prior art inverter outputs, these series connections of the current sink with the inverter's N channel device on the output provides a resistance which limits the response time of the inverter.

Although most output inverters will switch between the high and low voltage signal required in CMOS logic, the operating point about which they switch may vary considerably. This results from many factors including primarily manufacturing mismatch between the P and N channel devices. In the ideal situation, it is preferred that the output voltage be in the center of the output voltage swing when the input voltage is in the center of the input voltage swing. Thus the operating point should be the mid-point of the input voltage swing. One method of compensating a CMOS inverter for variations is to include variable resistive elements in series with the P channel device and in series with the N channel device which may be controlled inversely to each other to reach a balance. This method is illustrated in U.S. Pat. No. 3,914,702 to Gehweiler. Although Gehweiler improves the accuracy of the operating point of the inverter, it adds resistance to each of the current paths and thus consequently slows the response time of the inverter.

Thus, there exists a need for an interface circuit using a CMOS inverter as the output stage which has a fixed operating point and improved response time.

SUMMARY OF THE INVENTION

An object of the present invention is to provide an interface circuit with improved response time.

Another object of the present invention is to provide an interface circuit with a stable operating point.

A further object of the present invention is to provide an interface circuit using a CMOS output stage which has an improved response time and a determinable operating point.

Still another object of the present invention is to provide an interface circuit for TTL to CMOS logic which has a determinable operating point and is self-compensating for manufacturing tolerances.

These and other objects of the invention are attained by an interface circuit having a CMOS inverter with its N channel device being part of a controlled leg of a first current mirror and its P channel device being part of a controlled leg of a second current mirror. The other portion of the controlled leg of the first current mirror is connected in series with the N channel device and in parallel with the P channel device and operates as a variable current source responsive to the input signal. The other portion of the controlled leg of the second current mirror is connected in series with a P channel device and in parallel with the N channel device and operates as a variable current sink responsive to the input signal. The controlling legs of the first and second current mirrors include a reference input. The elements of the circuit are sized or designed such that the operating point of the inverter is the voltage on the reference input.

Other objects, advantages and novel features of the present invention will become apparent from the following detailed description of the invention when considered in conjunction with the accompanying drawings.

DESCRIPTION OF THE PREFERRED EMBODIMENTS

Figure 1:
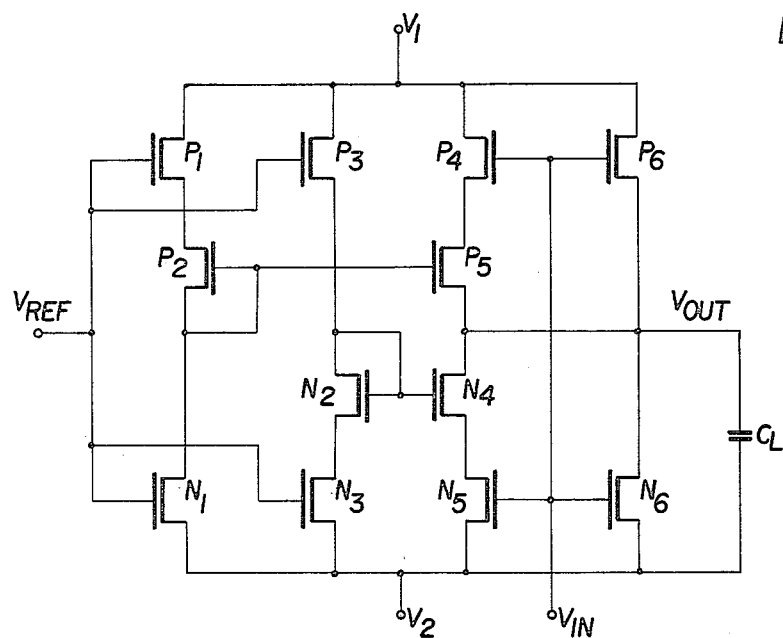
FIG. 1 is a schematic of an interface circuit incorporating the principles of the present invention.

An interface circuit is shown in FIG. 1 as including a complementary insulated gate field effect transistor inverter having a P channel device P6 and an N channel device N6 with their conduction paths connected in series between supply terminals V1 and V2. The input terminal VIN of the interface circuit is connected to the gates of the devices P6 and N6 which is the input to the inverter and the output terminal VOUT is connected to the drain connection of devices N6 and P6 which is the output of the inverter. A load capacitance CL is illustrated as being connected to the output terminal VOUT. Connected in parallel with inverter device P6 is the series combination of field effect transistors P4 and P5. The source of P4 is connected to the supply terminal V1 and the drain of P5 is connected to the output terminal VOUT. The gate of P4 is connected to the input terminal VIN and the gate of P5 is connected to a biasing circuit. Connected in parallel with inverter device N6 is the series combination of field effect transistors N4 and N5. The source of N5 is connected to the supply terminal V2 and the drain of N4 is connected to the output terminal VOUT. The gate of N5 is connected to the input terminal VIN and the gate of N4 is connected to a biasing circuit.

The biasing circuit for the gate of device P5 includes the series combination of field effect transistors P1, P2 and N1. The source of P1 is connected to the supply terminal V1, the source of N1 is connected to supply terminal V2, the gate of P2 is connected to its drain and the gates of devices P1 and N1 are connected to the reference input terminal VREF. The biasing circuit for the gate of N4 includes the series combination of field effect transistor P3, N2 and N3. The source of P3 is connected to the supply voltage V1, the source of N3 is connected to the supply voltage V2, the gate of N2 is connected to its drain and the gates of P3 and N3 are connected to the reference input terminal VREF.

The interface circuit of FIG. 1 is designed to produce an output signal which varies substantially between the values V1 and V2 where the input signal varies between a smaller range of values. Since the input signal may never reach V1 or V2, the inverter devices N6 and P6 are never appropriately turned off so as to completely or rapidly charge or discharge the capacitive load CL to the values V1 or V2. To compensate for this, devices P4 and P5 form a variable current source responsive to the input signal to provide the additional current being sunk by N6 when it is not totally off to allow rapid charging of the load CL by device P6. Similarly devices N4 and N5 form a variable current sink responsive to the input signal to sink the additional current provided by P6 when it is not totally off to allow rapid discharge of the load CL by the device N6.

The devices of the interface circuit are selected such that the operating point of the inverter including devices N6 and P6 is such that when the signal at VIN equals the signal at VREF the output voltage at VOUT has an amplitude midway between the supply voltages at terminals V1 and V2. Thus at the operating point, the current being sunk by N6 of the inverter must be equal to the current being sourced by P4 and P5 and the current being sourced by the inverter device P6 is being sunk by devices N4 and N5.

As the input voltage at VIN begins to go below the operating point or the signal at reference terminal VREF, device P6 of the inverter and P4 of the variable current source supply greater current while device N6 of the inverter and N5 of the current sink have their current sinking capacity reduced. Thus the voltage at the output terminal VOUT rises as the current is used to charge the output capacitive load CL. The additional speed in charging the output load CL is achieved by the ability of the variable current source including devices P4 and P5 to provide additional current. It should also be noted that since the current sinks N4 and N5 and the current sources P4 and P5 are not in series with the output and the main charging device P6, no additional resistance is added which would extend the charging time. As the input signal reaches its lowest design value, N6 is still conducting even though at a very low value. The variable current source P4 and P5 provide the current being sunk by N4, N5 and N6 at this point. Thus the current sinks N4, N5 and N6 will not sink current from the output terminal VOUT even though they are partially on. In the limiting case where VIN should go beyond its design value and approach the supply voltage on terminal V2, N5 and N6 will be shut off and consequently disconnect the additional current sink N4 from the output terminal VOUT.

As the input signal VIN goes above the operating point of the signal on terminal VREF, inverter device N6 will sink more current than before and device N5 of the variable current sink will cause the current sink N4 and N5 to sink more current than before. At the same time the inverter device P6 provides less current to the output and the variable current sources P4 and P5 generate less current. Consequently the output terminal VOUT sinks a substantial current and discharges the capacitive load CL. Since the devices P6 and P4 are never biased to a completely off condition for the design input levels, the current sink N4 and N5 sink the additional current produced by P6 and variable current source P4 and P5. This prevents any charging of the output load CL. In the limiting case of VIN approaches the supply terminal voltage at V1, device P4 is turned off and disconnects the variable current source including device P5. Since the variable current sink N4 and N5 and the variable current source P4 and P5 are not in the series circuit with the main sinking device N6 of the inverter and the output load, the discharge time is not adversely affected by these additional circuit elements.

Figure 2:
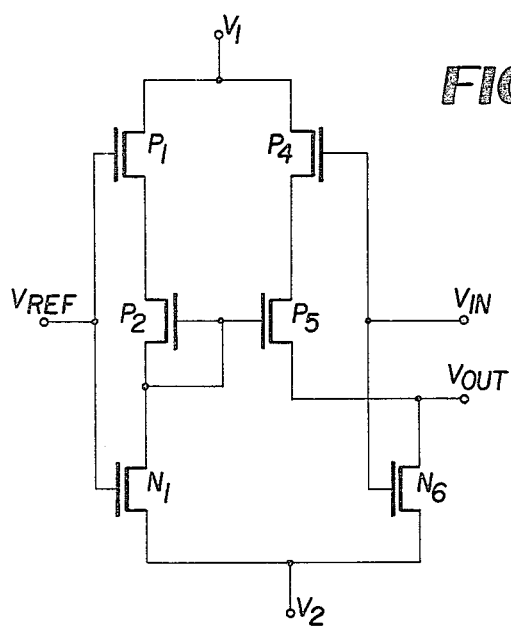
FIG. 2 is a schematic of a first current mirror of the circuit of FIG. 1.
Figure 3:
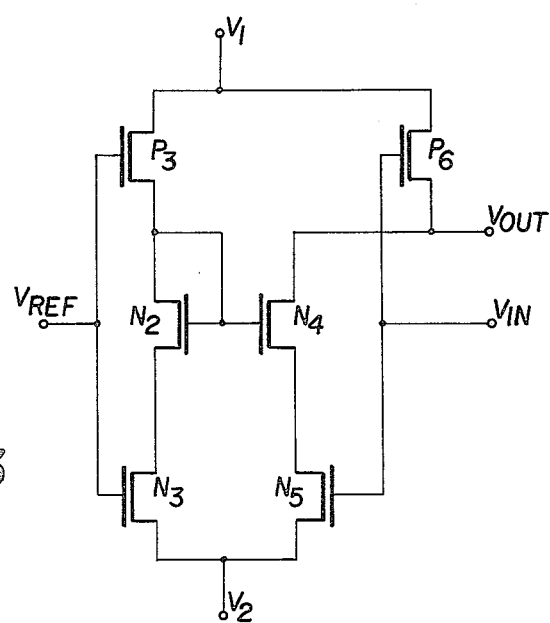
FIG. 3 is a schematic of a second current mirror portion of the circuit of FIG. 1.

To compensate for design mismatch of the devices of P6 and N6 in the inverter, the biasing circuit for device P5 is connected to constitute a current mirror as illustrated in FIG. 2 and the biasing circuit for N4 is connected as a second current mirror as illustrated in FIG. 3. The first current mirror illustrated in FIG. 2 has a controlling leg including devices P1, P2 and N1 and a controlled leg including devices P4 and P5 of the variable current source in a first portion and N6 of the inverter in a second portion. Interconnection of the gates of P2 and P5 of the controlling and controlled leg respectively to the drain of P2 form the current mirror. The current flowing into the drain of P2 will produce a gate to source voltage on P5 that will produce drain current in P5 equal to the drain current of P2. Thus if P1, P2 and N1 are built to match P4, P5 and N6, respectively, the two legs will be balanced. Since the operating point of the inverter is defined as VIN equals VREF, the current through N1 and N6 should also be identical at the operating point. Any mismatch which occurs during processing usually is mismatched between the N channel devices and the P channel devices. If, for example, the P channel devices as a result of manufacturing have a greater conductance than the N channel devices, the voltage at the drain of P2 will increase. This voltage increase which is applied to the gate of P5 will lower the transconductance of P5. Thus, the transconductance of the variable current source including P4 and P5 has been reduced to match the reduced transconductance of N6 and the controlled leg is balanced. Conversely, if the N channel devices have a greater transconductance than the P channel devices, the voltage on the drain of P2 and the gate of P5 will decrease thereby increasing the transconductance of P5 to match that of N6. Thus the current mirror structure, wherein the controlled leg includes a variable current source P4 and P5 and the N channel device N6 of the inverter, is self-compensating for manufacturing variances.

A second current mirror is illustrated in FIG. 3 as including a controlling leg including devices P3, N2 and N3 and a controlled leg including the variable current sink N4 and N5 in a first portion and the P channel device P6 of the inverter in a second portion. The drain of the device N2 is connected to the common connection of the gates N2 and N4 and constitutes a current mirror arrangement. The current flowing into the drain N2 will produce a gate to source voltage on N4 that will produce a drain current in N4 equal to the drain current of N2. The devices P3, N2 and N3 of the controlling leg are matched to the devices P6, N4 and N5 of the controlled leg, respectively. As with the current mirror of FIG. 2, the current mirror of FIG. 3 provides self-compensation for variance in the transconductance of the P and N channel devices resulting from the manufacturing processes and thus additional description of the compensation is not necessary.

The design of the parameters of the devices is predicated upon the requirement that the voltage at the output VOUT should be midway between the values of the supply voltages V1 and V2 when the input voltage is at VREF which must be $V2+VThN<VREF<V1-VThP$. This defines the operating range of VREF. Knowing these requirements, the appropriate size of the devices may be calculated.

It is evident from the preceding description of the prior art that the objects of the invention are attained in that an interface circuit is provided which is self-compensating for manufacturing tolerances, a determinate operating point, and has improved response time. Although the invention has been described and illustrated in detail, it is clearly understood that the same is by way of illustration and example only and is not to be taken by way of limitation. Although the circuit has been described as being designed specifically for TTL to CMOS, the principles and circuit are applicable to interface other systems wherein the input voltages are a low amplitude and a small swing to higher output voltages having a larger swing. The spirit and scope of this invention are to be limited only by the terms of the appended claims.

What is claimed:

1. An interface circuit having a signal input terminal, a reference terminal and a signal output terminal comprising:
   a complementary field effect transistor inverter having an N and P channel device connected between a pair of supply terminals with the input terminal of the circuit being the input of said inverter and the output terminal of said circuit being the output of said inverter;
   a first complementary field effect transistor current mirror means connected between said pair of supply terminals with the reference terminal being the input for the controlling leg and said N channel device being in a first portion of the controlled leg; and said signal input being an input to a second portion of the controlled leg; and
   a second complementary field effect transistor current mirror means connected between said pair of supply terminals with the reference terminal being the input for the controlling leg and said P channel device being in a first portion of the controlled leg and said input signal being an input to a second portion of the controlled leg.

2. An interface circuit according to claim 1 wherein said controlled legs of said first and second current mirror means characterized by setting the operating point of said inverter equal to the signal level of said reference terminal.

3. An interface circuit according to claim 1 wherein said first current mirror means includes a P channel device in said controlling leg having its drain connected to its gate and a P channel device in said second portion of said controlled leg having its gate connected to said drain of said P channel device of said controlling leg, and said second current mirror means includes an N channel device in said controlling leg having its drain connected to its gate and an N channel device in said second portion of said controlled leg having its gate connected to said drain of said N channel device of said controlling leg.

4. An interface circuit according to claim 3 wherein the controlling leg and the second portion of the controlled leg of said first current mirror means each include an additional P channel device with their gates connected to said reference terminal and said input terminal, respectively, and the controlling leg and the second portion of the controlled leg of said second current mirror means each include an additional N channel device with their gates connected to said reference terminal and said input terminal, respectively.

5. An interface circuit according to claim 1 wherein said second portion of said controlled leg of said first and second current mirror means includes a variable current source and a variable current sink, respectively, responsive to the signal on said input terminal.

6. An interface circuit having an input terminal and output terminal comprising:
   a complementary field effect transistor inverter having an N and P channel device connected between a pair of supply terminals with the input terminal of the circuit being the input of said inverter and the output terminal of the circuit being the output of said inverter;
   a variable current source means in series with the conduction path of said N channel device and in parallel with said P channel device for providing current for said N channel device as a function of the signal on the input terminal; and
   a variable current sink means in series with the conduction path of said P channel device and in parallel with said N channel device for providing a sink of current from said P channel device as a function of the signal on the input terminal;
   said variable current source means and said variable current sink means operate to decrease the response time of said inverter.

7. An interface circuit according to claim 6 including a first switch means connected in series with said variable current source means for disabling said variable current source means in response to an input signal of a first amplitude and a second switch means connected in series with said variable current sink means for disabling said variable current sink means in response to an input signal of a second amplitude.

8. An interface circuit according to claim 6 including a reference input terminal and biasing means interconnecting said reference input to said variable current source means and said variable current sink means for defining the operating point of said inverter.

9. An interface circuit according to claim 8 wherein said variable current source means is characterized by providing current equal to the sink current capacity of said N channel device when said circuit input signal equals said reference input signal, and said variable current sink means is characterized by sinking current equal to the current generated by said P channel device when said circuit input signal equals said reference input signal.

10. An interface circuit according to claim 6 wherein said variable current source means includes first variable means for varying the output of said variable current source means inversely proportional to the variance of said circuit input signal, and said variable current sink means includes second variable means for varying the sinking capacity of said variable current sink means directly proportional to the variance of said circuit input signal.

* * * * *